United States Patent

Asagi et al.

[11] Patent Number: 5,871,592
[45] Date of Patent: Feb. 16, 1999

[54] SOLDER AND SOLDERING METHOD

[75] Inventors: Osamu Asagi; Moriyuki Ebizuka; Koichi Shiozawa; Kiyoshi Ichikawa, all of Kanagawa, Japan

[73] Assignee: Sony Corporation, Tokyo, Japan

[21] Appl. No.: 714,308

[22] Filed: Sep. 18, 1996

[30] Foreign Application Priority Data

Sep. 20, 1995 [JP] Japan .................................... 7-267858

[51] Int. Cl.⁶ .................................................... H05K 3/32
[52] U.S. Cl. ........................ 148/24; 228/180.1; 228/242; 228/243
[58] Field of Search ............................. 228/180.1, 242, 228/243; 148/24

[56] References Cited

U.S. PATENT DOCUMENTS 5,137,936  8/1992  Akiguchi et al. ......................... 522/170

FOREIGN PATENT DOCUMENTS 3-363  1/1979  European Pat. Off. ......... H05K 3/24

*Primary Examiner*—Patrick Ryan
*Assistant Examiner*—M. Alexandra Elve
*Attorney, Agent, or Firm*—Hill & Simpson

[57] ABSTRACT

Soldering paste obtained by mixing solder material with photosetting flux, which hardens by the irradiation of ultraviolet light, is used for reflow soldering. The photosetting flux contains flux base material, flux base material solvent, a photopolymerization initiator and photosetting prepolymer. The soldering paste obtained by mixing this photosetting flux is printed and bonded on the surface of soldered portion of a printed substrate, and is brought into tight contact with the pad portion of a lead of an electronic part to be soldered. The surface of soldering paste exposed is irradiated with ultraviolet light to cause the surface to gel. Thereafter, soldering is effected by means of preliminary heating and solder melting and heating(reflow heating). Since the surface of the soldering paste is thereby hardened by the irradiation of ultraviolet light, no sags occur during preliminary heating, thus making it possible to prevent any defective bridge caused by sags.

8 Claims, 2 Drawing Sheets

SOLDER AND SOLDERING METHOD

BACKGROUND OF THE INVENTION

1. Field of the Invention

The present invention relates to soldering paste used to bond metallic materials and a soldering method using the same.

2. Description of Related Art

In order to package a part on the surface of a printed substrate, there is generally used a reflow soldering method, in which soldering is performed after following each of the processes shown in the process drawing of FIG. 2: soldering paste is bonded to a portion of a circuit pattern of the printed substrate by a printing method ①, a part is temporarily fixed to the printed substrate by means of adhesion, etc. ②, it is preliminarily heated at a temperature of about 150° C. for several minutes ③, and thereafter, the solder paste is melted and heated at an elevated temperature higher than the melt temperature of soldering particles of soldering paste, for example, 230° C. for scores of seconds ④, and is cooled ⑤ after the solder is melted for soldering.

The soldering paste comprises a mixture obtained by dispersing soldering particles in a flux mixture in which flux, solvent, adhesive mass and the like are mixed, and is printed or bonded to a printed substrate or the like by a screen printing method, etc.

The aforesaid printed soldering paste has paste-like viscosity at normal temperature, has an external shape having the same shape as the screen opening, and maintains a height equal to the thickness of the screen. However, it easily gets fluidized at high temperatures, and mostly starts being fluidized at a temperature of 50° C. to about 150° C.

When the soldering paste gets fluidized, its soldering particles flow into contact with the adjacent terminal electrode, causing a so-called defective bridge. The occurrence of this bridge causes a significant trouble in making the circuit pattern pitch narrower (0.5 mm or less) and miniaturizing the printed substrate.

FIG. 3 schematically shows the fluidization of soldering paste, or a process in which the defective bridge is caused; FIG. 3A shows a state before heating, and FIG. 3B shows the course of the reflow soldering process.

In FIG. 3, reference numeral 1 designates a part body such as QFP (Quad Flat Package); 2, a printed substrate; 3, a pad portion of a circuit pattern adapted to receive soldering paste; 4, lead wire for the part 1; and 5, soldering paste printed on the pad.

Reference numeral 6 designates soldering balls, which are soldering particles separated and isolated from a mountain of soldering paste 5 printed. They adhere to the substrate on printing, or are flowed and appear during heating, and these soldering balls 6 are fluidized in the heating process, thus causing a defective bridge.

In the reflow soldering process, as described above, a printed substrate 2, on which soldering paste 5 has been printed, is preliminarily heated as a preprocess for soldering by melting the solder.

This preliminary heating temperature is about 150° C., lower than a temperature at which solder melts, but the viscosity of flux lowers during the preliminary heating, the neighborhood of the surface of the soldering paste 5 printed is fluidized so that the shape at the time of the printing is collapsed, thus causing sags 5a in the soldering paste 5.

The sags 5a flow into contact with the adjacent terminal electrode side when the solder is melted, causing a defective bridge. The defective bridge due to the sags 5a occurs more noticeably, the narrower the pitch becomes.

As a soldering method to solve the above-described problem, there is proposed a soldering method for soldering a circuit wiring and lead wire by bringing each joint of the lead wire into tight contact with the circuit wiring through cream solder, enveloping the each joint and the cream solder in ultraviolet-curing resin, and exposing the ultraviolet-curing resin to light to cure it for heating (Japanese Patent Laid-Open No. Hei 7-176856).

In the aforesaid soldering method, however, an extra process for enveloping in the ultraviolet-curing resin is compelled to be added in, for example, the reflow soldering process.

It is an object of the present invention to provide soldering paste capable of soldering without causing any defective bridge based on sags in the soldering paste occurring during the aforesaid preliminary heating, and without adding any extra process, and a soldering method using the soldering paste.

SUMMARY OF THE INVENTION

Solder according to the present invention comprises a mixture of solder material and a photosetting flux which may be hardened by irradiation with light. The photosetting flux comprises a flux base material, a flux base material solvent, a photopolymerization initiator and a photosetting prepolymer.

A soldering method according to the present invention comprises the steps of: providing a first member and a second member to be soldered, applying a photosettable solder composition onto a surface of the first member, positioning the second member into tight contact with the photosettable solder and the first member, irradiating exposed portions with light to harden the solder surface, and thereafter, heating the assembled parts to reflow the solder composition to solder the first member and the second member together.

DETAILED DESCRIPTION OF PREFERRED EMBODIMENT

Soldering paste according to the present invention is characterized by a photosetting function of soldering flux. Namely, soldering paste capable of preventing the aforesaid sags from occurring by irradiating the soldering paste printed on a substrate with light to harden the surface of the soldering paste.

Although the structure of the aforesaid soldering paste will be described later, when light, for example, ultraviolet light is irradiated, the flux mixture on the surface of soldering paste exposed to outside hardens, but the soldering paste under the lead wire of a part which the ultraviolet light does not reach does not harden, but can normally solder while it remains paste-like.

When the surface of soldering paste hardens by the irradiation of ultraviolet light, the soldering paste does not sag even in the preliminary heating process. This enables normal soldering even if further heated in the postprocess.

Figure 1:
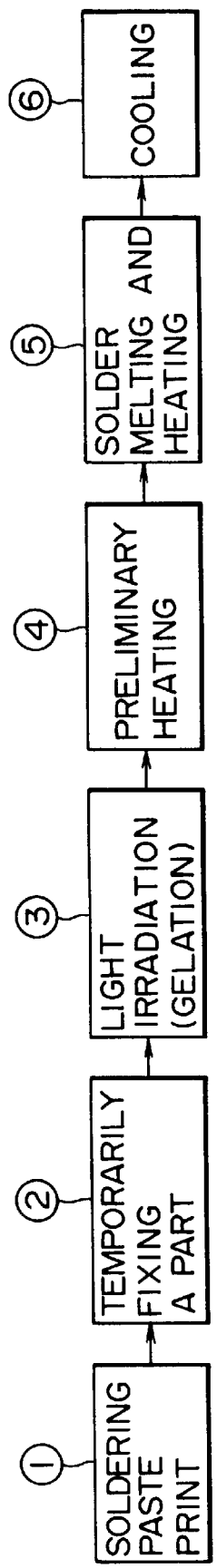
FIG. 1 is a process drawing for reflow soldering according to the present invention.
Figure 2:
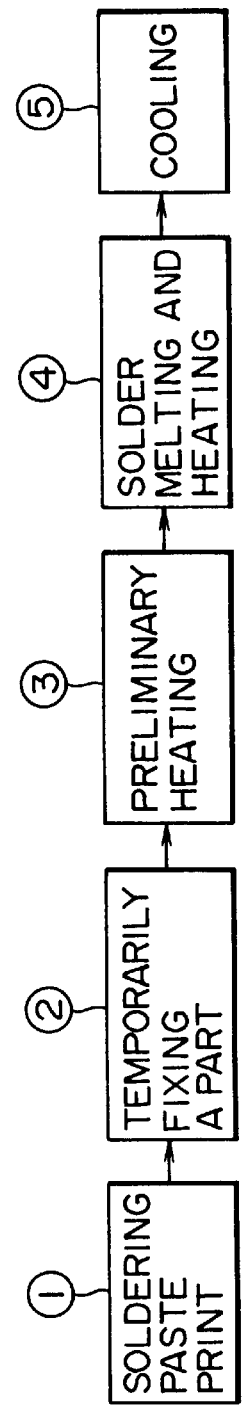
FIG. 2 is a process drawing for reflow soldering according to the prior art.
Figure 3A:
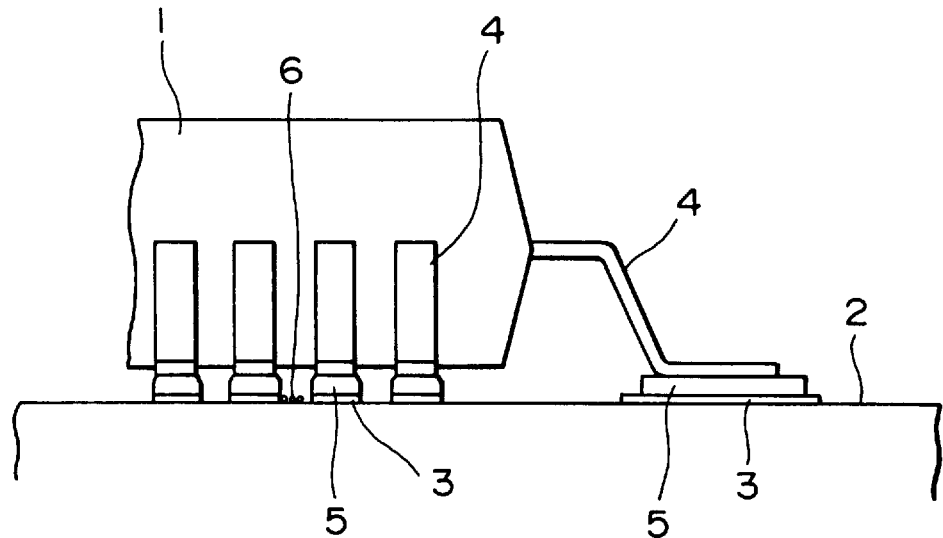
FIGS. 3A and 3B are side elevation views of a leaded package soldered to a circuit on a circuit board illustrating formation of a defective bridge in accordance with prior art soldering methods.
Figure 3B:
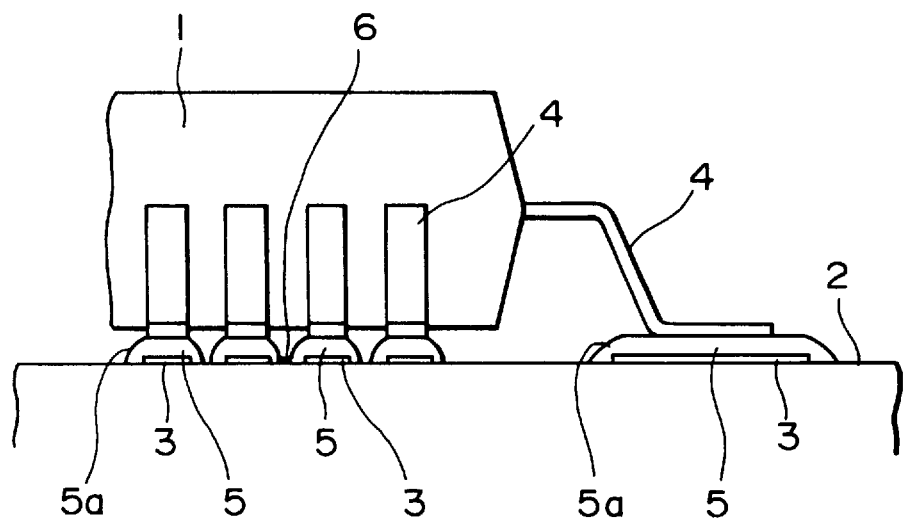

A soldering method according to the present invention using the aforesaid soldering paste is to eliminate the aforesaid defect by printing, in the reflow soldering process as shown in FIG. 1, on soldering paste ①, temporarily fixing a part ②, then irradiating the soldering paste with light ③ to cause the soldering paste surface to gel before preliminarily heating the soldering paste ④, and preventing the fluidization of the soldering paste surface during the preliminary heating ④.

By the way, in order not to prevent the soldering particles in the flux mixture of the soldering paste from combining at the melt temperature of the soldering particles, it is necessary to soften them at high temperature, and to have fluidity, and at least the interior of the soldering paste must not completely harden.

Therefore, the hardening of the soldering paste by the irradiation of light ③ in the soldering method according to the present invention is not completely performed, but is preferably lower than the gelation level as the pre-stage of hardening.

The flux mixture of the soldering paste is composed of flux base material, base material solvent, photosetting prepolymer, a photopolymerization initiator and the like.

The flux base material is composed of principal ingredients of flux such as gum rosin and synthetic rosin, organic acid such as adipic acid, flux activator such as amine halide, and viscosity, adhesion, cohesion and thixotropic properties modifiers, and combinations widely put to practical use can be used.

As the photosetting prepolymer, simple substances of oligomer such as acrylic ester, methacrylate ester, epoxy acrylate, and urethane acrylate, their combinations with acrylic monomer and the like are suitable, and in particular, urethane acrylate, which is free from inhibited cure in oxygen, or its mixed member with acrylic monomer is excellent because it is cured with ultraviolet light in a short time.

Even when photosetting prepolymer, which is susceptible to inhibited cure in oxygen, is used, the inhibited cure can be avoided by effecting photosetting in a nitrogen atmosphere reflow furnace.

As a photopolymerization initiator, benzoin, benzyl, and their derivatives such as benzoin isopropyl ether are suitable, and further amine group may be added as a sensitizing agent.

The base material solvent is used to adjust to viscosity suitable for printing as the flux mixture, and includes high boiling alcohol, glycol ether, ester and the like. It can be selected from among those widely for practical use while taking into consideration the compatibility with flux agents and photosetting prepolymer.

After the solder is melted, the ultraviolet-uncured flux mixture which has appeared is heated in a high-temperature heating process to follow, and a heat polymerization initiator for heat curing is mixed in advance.

Preferably, the temperature, of the heat polymerization initiator, for starting to cure the flux mixture is higher than the melt temperature of soldering particles, and the mechanism for curing is the same as that for the ultraviolet curing. If these curing mechanisms are the same, the composition for curing the flux mixture does not become complicated.

As a mechanism for the aforesaid curing, a free-radical polymerization type is suitable. For the heat polymerization initiator, organic peroxide, which decomposes rapidly at a specified temperature to produce free radical, which cures a flux mixture, can be easily selected. Also, for photopolymerization initiator, the free-radical polymerization type can be easily selected.

An example of the composition of soldering paste according to the present invention is as follows:

| | |
|---|---|
| Tin solder powder | 90.0 parts by weight |
| Flux base material (rosin, activator, viscosity imparting agent) | 5.5 parts by weight |
| Urethane acrylate (photosetting prepolymer) | 2.5 parts by weight |
| Benzoin isopropyl ether (photo-setting initiator) | 0.1 part by weight |
| 2-phenoxy ethanol (base material solvent) | 2.0 parts by weight |
| Peroxy ketal (heat polymerization initiator) | 0.1 parts by weight |

When soldering paste having the aforesaid composition obtained by dispersing soldering particles in a flux mixture to which photosetting properties are imparted is printed on a substrate, a part is temporarily bonded thereto, and ultraviolet light of 0.1 W/cm$^2$ is irradiated onto the surface of the soldering paste for two minutes, the surface becomes a gelled state though the interior is sufficiently soft.

In short, the irradiation of ultraviolet light causes the surface portion exposed of soldering paste to gel, and does not cause a portion hidden under the part terminal to.

Subsequently, when heated in the reflow soldering process (solder melting and heating process ⑤), the part lead 4 is satisfactorily soldered to the substrate pad portion 3 to form cured, elastic film of the flux mixture on the surface thereof. Soldering balls 6 bonded to a substrate 2 when soldering paste is printed are fixed to the bonded position as they are, and soldering balls 6 due to sags are not produced, thus preventing any defective bridge due to them.

With a large-sized electronic part having minute pitches, a wicking phenomenon, in which solder on the pad surface is sucked up on the part side, is prone to occur, and with a minute chip part, a Manhattan phenomenon, in which solder on one terminal of the chip melts earlier and surface tension of the solder exerts on the end portion to raise the chip, is prone to occur.

The wicking phenomenon causes defective connection because the amount of solder to connect the terminal to the pad is insufficient, and the Manhattan phenomenon also causes an irreparable defect.

When elastic film of a flux mixture is formed, the aforesaid wicking phenomenon becomes difficult to occur because the photosetting resin prevents spreading of flux ingredient over the terminal portion or flow of the solder. Of the surface of terminal of the chip part, the photosetting resin stops the flow of the solder for other than a portion requiring the flow of solder, and therefore, the occurrence of torque to raise the chip is restrained, thus preventing the Manhattan phenomenon. For this reason, soldering for substrate packaging, in which large-sized electronic parts (IC) and minute chip parts are mixedly present, becomes also easier although it was conventionally difficult.

In the processes of the aforesaid soldering method, by replacing the temporary part fixing with the light irradiation, the surface of soldering paste may be irradiated with ultraviolet light for gelation after soldering paste is printed, and thereafter the part may be temporarily fixed.

Heretofore, soldering paste prone to cause a defective bridge could not be practically used even if it has good printing characteristics, but the soldering paste can be selected for use giving priority to the printing characteristics according to the soldering method of the present invention.

According to solder of the present invention, since no sags of the solder occur during preliminary heating, it is capable of easily coping with narrower pitches and miniaturized printed substrates, and both quality and reliability of products for which soldering has been completed are improved.

What is claimed is:

1. A soldering method for soldering a first circuit member to a second circuit member, comprising the steps of:

providing a first circuit member having at least one contact region to be soldered;

applying a photosettable and thermally curable solder paste composition to said contact region in a desired configuration;

irradiating the applied solder paste with ultraviolet light to partially photoset and harden a surface portion of the applied solder paste so that said desired configuration is maintained;

providing a second circuit member having at least one second contact region to be soldered;

positioning the second contact region in intimate contact with the irradiated solder paste to form an assembly; and thereafter, heating the assembly to reflow and fully cure the solder paste, thereby soldering the first and the second circuit members together.

2. A soldering method as defined in claim 1, wherein in said applying step, the solder paste composition is printed onto the first circuit member.

3. A soldering method as defined in claim 1, wherein in said irradiating step, the soldered paste is irradiated with 0.1 W/cm$^2$ of UV light until the surface of the solder paste becomes gelled and an interior portion of the solder paste remains soft.

4. A soldering method as defined in claim 1, wherein said first circuit member is circuit wiring formed on a printed substrate, and said second circuit member is a lead of an electronic part to be packaged on said printed substrate.

5. A soldering method as defined in claim 2, wherein said first circuit member is circuit wiring formed on a printed substrate, and said second circuit member is a lead of an electronic part to be packaged on said printed substrate.

6. A soldering method for soldering a first circuit member to a second circuit member comprising the steps of:

providing a first circuit member having at least one contact region to be soldered;

applying a photosettable and thermally curable solder paste composition to said contact region in a desired configuration;

providing a second circuit member having at least one second contact region to be soldered;

positioning the second contact region in intimate contact with the applied solder paste to form an assembly;

irradiating exposed portions of the applied solder paste in the assembly with ultraviolet light to partially photoset and harden a surface portion of the applied solder paste so that said desired configuration is maintained; and thereafter, heating the assembly to reflow and fully cure the solder paste, thereby soldering the first and the second circuit members together.

7. A soldering method as defined in claim 6, wherein in said applying step, the solder paste composition is printed onto the first circuit member.

8. A soldering method as defined in claim 6, wherein in said irradiating step, the solder paste is irradiated with 0.1 W/cm$^2$ of UV light until the surface of the solder paste becomes gelled and an interior portion of the solder paste remains soft.

* * * * *